(12) United States Patent
Egawa

(10) Patent No.: US 6,777,797 B2
(45) Date of Patent: Aug. 17, 2004

(54) STACKED MULTI-CHIP PACKAGE, PROCESS FOR FABRICATION OF CHIP STRUCTURING PACKAGE, AND PROCESS FOR WIRE-BONDING

(75) Inventor: Yoshimi Egawa, Miyazaki (JP)

(73) Assignee: Oki Electric Industry. Co., Ltd., Tokyo (JP)

(*) Notice: Subject to any disclaimer, the term of this patent is extended or adjusted under 35 U.S.C. 154(b) by 0 days.

(21) Appl. No.: 10/330,321

(22) Filed: Dec. 30, 2002

(65) Prior Publication Data

US 2004/0000723 A1 Jan. 1, 2004

(30) Foreign Application Priority Data

Jun. 27, 2002 (JP) ........................................ 2002-187441

(51) Int. Cl.[7] .............................................. H01L 23/02
(52) U.S. Cl. ...................................... 257/686; 257/777
(58) Field of Search ................................ 257/686, 685, 257/777, 723, 724, 730

(56) References Cited

U.S. PATENT DOCUMENTS

| 5,081,563 | A | * | 1/1992 | Feng et al. |
| 6,005,778 | A | * | 12/1999 | Spielberger et al. |
| 6,351,028 | B1 | * | 2/2002 | Akram et al. |
| 6,424,034 | B1 | * | 7/2002 | Ahn et al. |

FOREIGN PATENT DOCUMENTS

| JP | 59-225556 | 12/1984 |
| JP | 61-043461 | 3/1986 |
| JP | 06-244360 | 9/1994 |
| JP | 2000-049279 | 2/2000 |
| JP | 2000-058742 | 2/2000 |
| JP | 2003-007902 | 1/2003 |
| JP | 2003-078106 | 3/2003 |
| JP | 2003-204033 | 7/2003 |

* cited by examiner

*Primary Examiner*—S. V. Clark
(74) *Attorney, Agent, or Firm*—Rabin & Berdo, PC

(57) ABSTRACT

A stacked multi-chip package includes a substrate, a first chip and a second chip. The first chip is fixed to the substrate, and is provided with a collar portion which opposes an upper face of the substrate in a state such that a gap is formed between the upper face of the substrate and the collar portion. The second chip is disposed in a region below the collar portion. The second chip is fixed to the substrate and does not make contact with the first chip.

25 Claims, 12 Drawing Sheets

F I G. 5
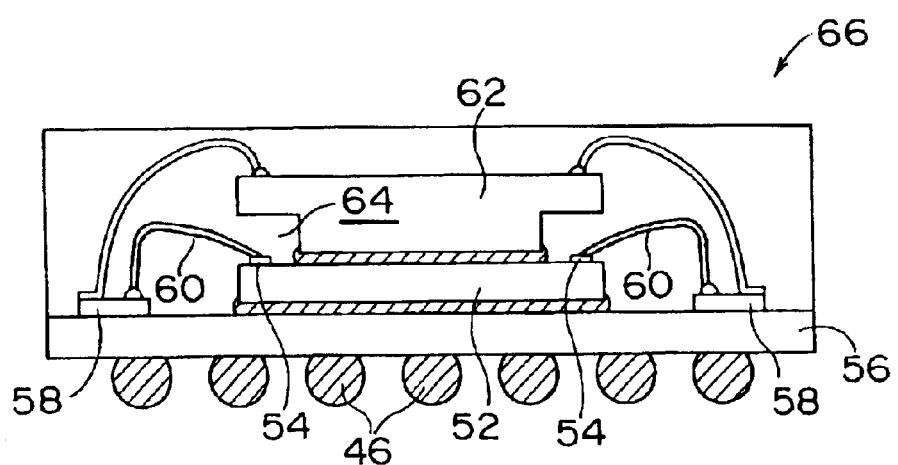

FIG. 9A
FIG. 9B
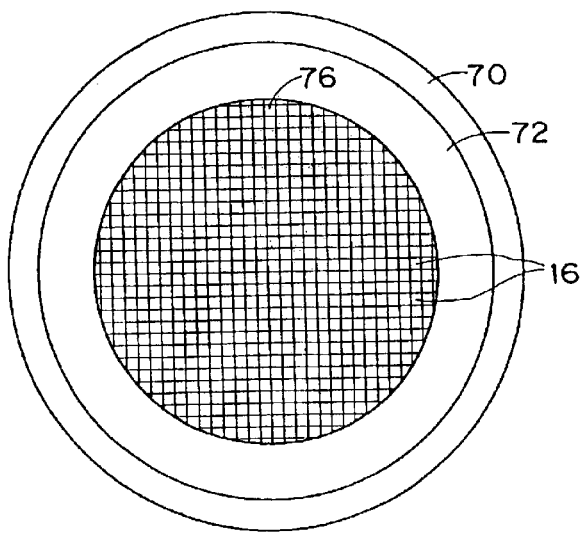
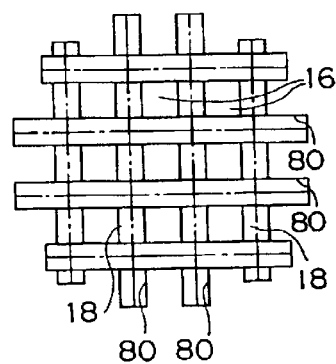

STACKED MULTI-CHIP PACKAGE, PROCESS FOR FABRICATION OF CHIP STRUCTURING PACKAGE, AND PROCESS FOR WIRE-BONDING

BACKGROUND OF THE INVENTION

1. Field of the Invention

The present invention relates to a stacked multi-chip package in which a plurality of chips are encapsulated in a stacked state, and to a process for fabricating a chip structuring the multi-chip package and to a wire-bonding process.

2. Description of the Related Art

In recent years, while increases in capability, function as well as the miniaturization of of electronic devices have been remarkable, further progress in raising the capabilities of mounted semiconductor devices and high-density packaging have been called for. Accordingly, the demand for stacked multi-chip packages, in which semiconductor devices are implemented three-dimensionally, for thin-form, high volume devices such as I.C. memory cards has become very considerable.

FIG. 12 shows a conventional stacked multi-chip package 100 in which semiconductor devices are mounted in three dimensions. The stacked multi-chip package 100 is structured by chips 102 and 104, a glass epoxy substrate 106, and solder balls 105. Chips 102 and 104 are formed at substantially the same size. Chips 102 and 104 are mounted on the glass epoxy substrate 106, and the solder balls 105 are provided at a lower face side of the glass epoxy substrate 106. Thus, the stacked multi-chip package 100 is a two-chip layer structure in which the chips 102 and 104 are stacked.

Hereinafter, the chip 102 is referred to as the upper chip 102 and the chip 104 is referred to as the lower chip 104. The upper chip 102 and the lower chip 104 are electrically connected, via gold wires (Au wires) 110, by a wire-bonding process with bonding posts 108 which are provided on the glass epoxy substrate 106.

Here, because the upper chip 102 and the lower chip 104 are formed so that they are substantially the same size, a spacer 112 is disposed between the upper chip 102 and the lower chip 104, and a gap is formed between the upper chip 102 and the lower chip 104 by the spacer 112. Thus, at least one connection between the lower chip 104 and the bonding posts 108 by one or more Au wires 110 is enabled.

However, in the stacked multi-chip package 100 having the structure described above, only the Au wires 110 are connected between the upper chip 102 and the lower chip 104, and the gap between the upper chip 102 and the lower chip 104 is not utilized effectively. Moreover, even though there are only two chips, the stacked multi-chip package 100 has substantially the same height as a three chip layer structure, and the resulting thickness of the stacked multi-chip package 100 is large. Consequently, the stacked multi-chip package 100 cannot be mounted in electronic devices of a standard size, generally where the maximum thickness is 1.4 mm, or a thin-form size, generally where the maximum thickness is 1.2 mm.

SUMMARY OF THE INVENTION

In consideration of the circumstances described above, an object of the present invention is to provide a thin-form stacked multi-chip package which can effectively utilize the space between the lower chip 104 and the upper chip 102 (or the glass epoxy substrate 106).

A stacked multi-chip package relating to a first aspect of the present invention is a stacked multi-chip package that includes: a substrate; a first chip fixed at the substrate, the first chip including a collar portion which faces an upper face of the substrate in a state such that a gap is provided between the upper face of the substrate and the collar portion; and a second chip disposed in a region downward of the collar portion and fixed at the substrate with out contacting the first chip.

In the structure described above, the first chip is fixed at the upper face of the substrate. The collar portion, which opposes the upper face of the substrate, is provided at the first chip in a state such that the gap is provided between the first chip and the upper face of the substrate. The second chip is disposed in a region downward of the collar portion, and is fixed to the substrate so as not to make contact with the first chip.

Accordingly, the gap can be provided between the first chip and the substrate because the collar portion is formed at the first chip. Consequently, disposing the second chip in this gap is possible.

Because the second chip is fixed to the substrate in a state of not contacting with the first chip, a gap is formed between the second chip and the collar portion. Thus, the second chip can be directly connected with the substrate by metallic wires such as gold wires (Au wires) or the like. Consequently, the first chip and the substrate can be connected with metallic wires or the like without a spacer being disposed between the first chip and the substrate.

Accordingly, the cost of material for a spacer can be saved and, because a spacer is not used, the number of components is decreased, there are fewer production steps, and productivity is improved. Moreover, because the first chip is directly fixed to the substrate, stability of the first chip is better than in a case in which a first chip is fixed to a substrate via a spacer, and reflow resistance is improved. Furthermore, because the collar portion is provided at the first chip, surface area can be made greater.

In the first aspect, the first chip may be substantially T-shaped in cross-section.

The gap formed between the upper face of the substrate and the collar portion may be set to a size such that the collar portion does not make contact with connection members which electrically connect the second chip with the substrate. Accordingly, the second chip and the substrate can be directly connected by metallic wires.

An insulating member may be provided at a rear face side of the collar portion. Thus, there will be no problems even if the metallic wires, which electrically connect the second chip with the substrate, make contact with the insulating member. Therefore, a rising height of the connection members when the connection members are connected by a bonding device is not restricted.

Consequently, a level of precision of the bonding device that would be required for lowering the rising height of the connection members can be reduced, and a degree of freedom of the bonding device to be used can be increased.

Electrode pads, which are electrically connected with the connection members, are provided at the second chip. These electrode pads may be formed of nickel and gold. Accordingly, due to the electrode pads being formed of nickel and gold, the electrode pads play a role as impact absorbers, and bonding from the bonding posts on the substrate to the electrode pads on the second chip is enabled.

The connection members may be metallic wires, and these metallic wires are wired from the substrate to the second chip. Thus, because the metallic wires are wired from the substrate to the second chip, the metallic wires rise at the bonding posts side provided at the substrate, and peak portions of the metallic wires at the second chip side can be made lower. Accordingly, the gap formed between the first chip and the second chip can be made smaller, and thickness of the stacked multi-chip package can be made thinner.

Yet further again, the first chip may be specified to be a logic device and the second chip may be specified to be a storage device. Ordinarily, the profile of a logic device is larger than that of a storage device. Therefore, by making the first chip a logic device and making the second chip a storage device, it is intended that the stacked multi-chip package can be made more compact.

Furthermore, in the first aspect, a third chip may be interposed between the first and second chips and the substrate. The profile of the third chip is substantially the same as the profile of the first chip. Accordingly, in a state in which the second chip is fixed to the third chip, end faces of the second chip are disposed at an inner side from end faces of the third chip. Consequently, the third chip can also be connected with the substrate by metallic wires. Hence, a three-chip layer structure can be provided. Moreover, because the profile of the third chip is substantially the same size as the profile of the first chip, a population area is larger with the same area of chips.

The first chip and the substrate may be electrically connected by metallic wires wired from the first chip to the substrate, and the thickness of the collar portion set to substantially half of the thickness of the first chip.

A stacked multi-chip package relating to a second aspect of the present invention is a stacked multi-chip package that includes: a substrate; a first chip including an upper face which includes a first electrode pad, a lower face whose area is smaller than an area of the upper face, and a side face connecting the upper face and the lower face, the lower face being fixed on the substrate; first metallic wire electrically connecting the first electrode pad with the substrate; a second chip disposed below the first chip and including an upper face which includes a second electrode pad, the second chip being disposed at a location separated by a predetermined distance from the side face of the first chip; and second metallic wire electrically connecting the second electrode pad with the substrate.

In the second aspect, the first chip may be substantially T-shaped in cross-section.

A distance from the upper face of the second chip to the side face may be larger than a distance from the upper face of the second chip to a peak portion of the second metallic wires. Consequently, the second chip and the substrate can be directly connected by the metallic wires.

An insulating member may be provided at the side face. Thus, there will be no problems even when the metallic wires, which electrically connect the second chip with the substrate, make contact with the insulating member. Therefore, a rising height of the second metallic wires when the second metallic wires are connected by a bonding device is not restricted.

Consequently, a level of precision of the bonding device that would be required for lowering the rising height of the second metallic wires can be reduced, and a degree of freedom of the bonding device to be used can be increased.

The second electrode pads may be formed of nickel and gold. Accordingly, due to the second electrode pads being formed of nickel and gold, the second electrode pads play a role as impact absorbers, and bonding from the bonding posts at the substrate side to the second electrode pads is enabled.

The second metallic wires may be wired from the substrate to the second chip. Thus, because the second metallic wires are wired from the substrate to the second chip, the second metallic wires rise at the bonding posts side provided at the substrate, and peak portions of the second metallic wires at the second chip side can be made lower. Accordingly, the distance between the side face of the first chip and the lower face of the second chip can be made smaller, and thickness of the stacked multi-chip package can be made thinner.

In the second aspect, the first chip may be specified to be a logic device and the second chip may be specified to be a storage device. Due to the profiles of logic devices being larger than those of storage devices, it is intended that the stacked multi-chip package can be made more compact by making the first chip a logic device and the second chip a storage device.

A third chip may be interposed between the first and second chips and the substrate. The profile of the third chip is substantially the same as the profile of the first chip.

Accordingly, in a state in which the second chip is fixed to the third chip, end faces of the second chip are disposed at an inner side from end faces of the third chip. Consequently, the third chip can also be connected with the substrate by metallic wires. Hence, a three-chip layer structure can be provided. Moreover, because the profile of the third chip is substantially the same as the profile of the first chip, a population area is larger with the same area of chips.

A process for fabricating a chip provided with a collar portion, relating to a third aspect of the present invention, is a process that includes: machining mutually parallel recess portions in one face of a wafer at which a plurality of chips are coplanarly disposed; machining recess portions which are transverse with respect to the mutually parallel recess portions; and cutting the wafer along width direction center lines of the respective recess portions.

A process for fabricating a chip provided with a collar portion, relating to a fourth aspect of the present invention, is a process that includes: etching mutually parallel recess portions in one face of a wafer at which a plurality of chips are coplanarly disposed; etching recess portions which are transverse with respect to the mutually parallel recess portions; and cutting the wafer along width direction center lines of the respective recess portions.

A process for wire-bonding a chip relating to a fifth aspect of the present invention is a process that includes: forming an electrode pad with nickel and gold, to which metallic wire can be attached for electrically connecting the chip with a substrate; and wiring the metallic wire from the substrate to the chip.

Consequently, the metallic wires rise at the bonding posts side provided at the substrate, and peak portions of the metallic wires at the second chip side can be made lower. Accordingly, a distance between a side face of a first chip and a lower face of a second chip can be made smaller, and thickness of a stacked multi-chip package can be made thinner.

A stacked multi-chip package relating to a sixth aspect of the present invention is a stacked multi-chip package that includes: a substrate including a front face; a chip body fixed at the front face of the substrate and including a first face, with a gap being formed between the first face and the front face of the substrate, and a connecting portion which connects the chip body with the substrate; and a fixed chip fixed at the front face of the substrate with out contacting the chip body, at least a portion of the fixed chip being disposed in the gap, wherein the portion of the fixed chip includes an upper face which opposes the first face of the chip body, and the upper face is disposed upward relative to the connecting portion.

A stacked multi-chip package relating to a seventh aspect of the present invention is a stacked multi-chip package according to the sixth aspect, in which the chip body further includes: a chip disposed to be separated a predetermined distance upward from the front face of the substrate; and a spacer disposed between the chip and the substrate.

BRIEF DESCRIPTION OF THE DRAWINGS

FIG. 5 is a sectional view showing a fourth embodiment of the stacked multi-chip package of the present invention.

FIG. 9A is a plan view showing a wafer, which illustrates a process for producing the upper chip structuring the stacked multi-chip package relating to the embodiment of the present invention.

FIG. 9B is a partial enlarged view of FIG. 9A.

DESCRIPTION OF THE PREFERRED EMBODIMENTS

A stacked multi-chip package relating to an embodiment of the present invention will now be described.

Figure 1:
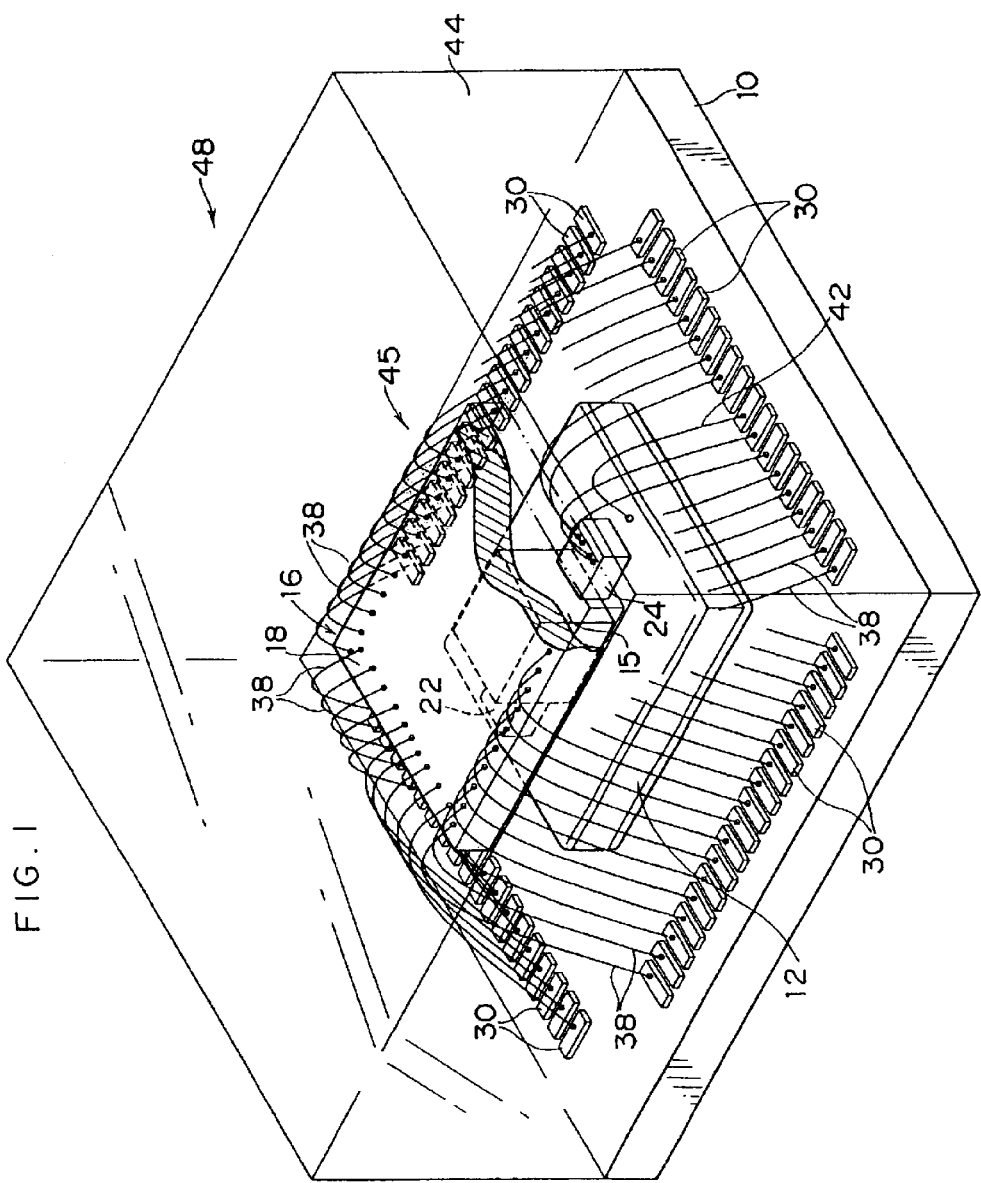
FIG. 1 is a perspective view, a part of which is cut away, showing a stacked multi-chip package relating to an embodiment of the present invention.
Figure 2A:
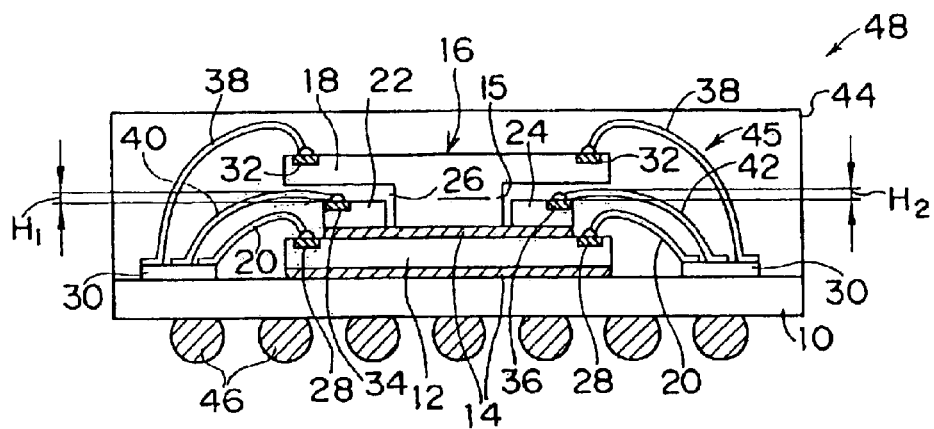
FIG. 2A is a sectional view showing the stacked multi-chip package relating to the embodiment of FIG. 1 of the present invention.
Figure 2B:
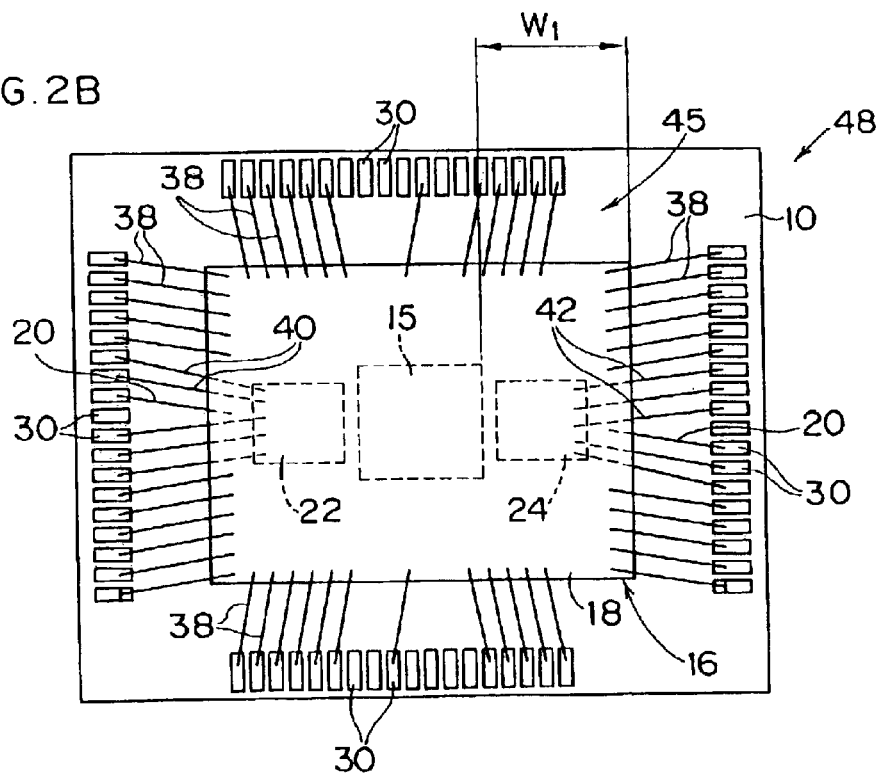
FIG. 2B is a plan view showing the stacked multi-chip package relating to the embodiment of FIG. 1 of the present invention.

As shown in FIGS. 1, 2A and 2B, a lower chip 12 (a third chip) such as a substantially cuboid ROM or the like is mounted at a central portion of a rectangular glass epoxy substrate 10. A liquid-form thermosetting or sheet-form thermoplastic adhesive 14 is applied to a lower face of the lower chip 12 resulting in the lower chip 12 being fixed to the glass epoxy substrate 10 by the adhesive 14.

A collar portion 18 extends outward in four directions from one end face of a substantially cuboid base portion 15 at the lower chip 12. An upper chip 16, corresponding to a first chip and a chip body, such as a logic unit or the like, whose cross section is T-shaped, is mounted at the lower chip 12. An external profile of the collar portion 18 and an external profile of the lower chip 12 are substantially the same. The adhesive 14 is applied to the upper chip 16, and the upper chip 16 is fixed at an upper face central portion of the lower chip 12 by said adhesive 14.

Here, because the collar portion 18 is provided at the upper chip 16, and a face at an opposite side from the collar portion 18 (an other end face of the base portion 15) is fixed to the lower chip 12, a gap 26 is formed between a rear face of the collar portion 18 and the upper face of the lower chip 12.

By utilizing the gap 26, an intermediate chip 22 corresponding to a second chip and a fixed chip, such as a flash memory or the like and another intermediate chip 24 corresponding to the second chip, such as an SRAM or the like can be disposed in the gap 26. Herein, the intermediate chip 22 and the intermediate chip 24 are disposed in a state of non-contact with the base portion 15.

Bonding posts 30 are arranged on the glass epoxy substrate 10 in lines (which may be staggered) running along end faces of the lower chip 12, at predetermined distances from the end faces of the lower chip 12.

Correspondingly, in FIG. 2A, aluminum pads (Al pads) 32, 28, 34 and 36 are arranged in lines (which may be staggered) running along end faces at outer peripheral sides of respective upper faces of the upper chip 16, the lower chip 12, the intermediate chip 22 and the intermediate chip 24.

Accordingly, electrical connection of the upper chip 16 with the bonding posts 30 via wiring Au wires 38 by bonding is enabled. Moreover, electrical connection of the lower chip 12 with the bonding posts 30 via wiring Au wires 20 by bonding is enabled, electrical connection of the intermediate chip 22 with the bonding posts 30 via wiring Au wires 40 by bonding is enabled, and electrical connection of the intermediate chip 24 with the bonding posts 30 via wiring Au wires 42 by bonding is enabled.

First, in the fabrication process of a multi-chip 45 with a three-chip layer structure, the lower chip 12 is fixed on the glass epoxy substrate 10 with the adhesive 14. Next, a bonding apparatus (not shown) is moved from the Al pads 28 of the lower chip 12 to the bonding posts 30, the bonding is performed resulting in the interconnection of the Au wires 20.

Thereafter, the intermediate chip 22 and the intermediate chip 24 are fixed at the upper face of the lower chip 12 with the adhesive 14. Then the bonding apparatus is moved from the Al pads 34 of the intermediate chip 22 to the bonding posts 30, performs bonding, and thus interconnects the Au wires 40. In the same way, the bonding apparatus is moved from the Al pads 36 of the intermediate chip 24 to the bonding posts 30, performs bonding, and thus interconnects the Au wires 42 (this wiring sequence of the intermediate chip 22 and the intermediate chip 24 may be reversed).

Next, the upper chip 16 is fixed at the upper face of the lower chip 12 with the adhesive 14, and then the bonding apparatus is moved from the Al pads 32 of the upper chip 16 to the bonding posts 30, and interconnects the Au wires 38.

Here, when wiring of the Al pads 32, 28, 34 and 36 to the bonding posts 30 by the Au wires 38, 20, 40 and 42 is carried out, the Au wires 38, 20, 40 and 42 rise a little from the Al pads 32, 28, 34 and 36, respectively, and are thence interconnected to the bonding posts 30.

Therefore, it is necessary to determine the size of the gap 26 formed between the rear face of the collar portion 18 and the upper face of the lower chip 12 in consideration of rising heights $H_1$ and $H_2$ of the Au wires 40 and 42 from the Al pads 34 and 36 of the intermediate chips 22 and 24, such that the Au wires 40 and 42 do not conductively connect the intermediate chips 22 and 24 and the upper chip 16.

In other words, it is necessary to set the gap 26 to a size greater than a combination of the thickness of adhesive 14 and the thickness of an intermediate chip 22 or 24 and the rising height $H_1$ or $H_2$, so that the Au wires 40 and 42 that connect the intermediate chips 22 and 24 with the glass epoxy substrate 10 do not make contact with the upper chip 16.

In addition, it is required to set the intermediate chips 22 and 24 so as not to be contacted with the base portion 15 or the Al pads 28 provided at the lower chip 12. Accordingly, as shown in FIG. 2B, a lateral depth $W_1$ of the gap 26 is set to about 0.3 to 0.5 mm from an end face of the collar portion 18, and consideration must be given to mounting accuracy in accordance with overflow amounts of the adhesive 14 and size requirements, for bonding of the Au wires 20 at the lower chip 12, of the intermediate chip 22 and the intermediate chip 24.

Furthermore, when bonding from the upper chip 16 to the glass epoxy substrate 10 is carried out, the bonding apparatus contacts the upper chip 16, and a pressing force is applied to the upper chip 16. Therefore, because it is necessary to maintain a minimum strength for the time of bonding at the upper chip 16, it is desirable when the gap 26 is no more than half the thickness of the upper chip 16.

When the conditions described above are satisfied, the intermediate chips 22 and 24 can be disposed in the gap 26 provided between the upper chip 16 and the lower chip 12, and the multi-chip 45 with a three-chip layer structure is formed.

The multi-chip 45 is sealed in an encapsulation body 44, and solder balls 46 are attached at a lower face of the glass epoxy substrate 10. Thus, a stacked multi-chip package 48 with an FBGA (Fine-pitch Ball Grid Array) structure is provided.

Next, operation of the stacked multi-chip package relating to the embodiment of the present invention will be described.

As shown in FIGS. 2A and 2B, the gap 26 can be provided between the upper chip 16 and the lower chip 12 by the collar portion 18 being formed at the upper chip 16. As a result, the lower chip 12 can be connected with the glass epoxy substrate 10 via the Au wires 20, even without a spacer being disposed between the upper chip 16 and the lower chip 12.

Consequently, material expenses can be reduced by the cost of a spacer and, because the spacer is not used, the number of components is reduced, there are fewer production steps, and productivity is improved. Moreover, because the upper chip 16 is directly fixed to the lower chip 12, stability of the upper chip 16 is better than in a case in which the upper chip 16 is fixed to the lower chip 12 via a spacer, and reflow resistance is improved.

Furthermore, because the collar portion 18 is provided at the upper chip 16, a front face area of the upper chip 16 can be increased, and it is therefore possible to dispose the intermediate chips 22 and 24 in the gap 26 formed between the collar portion 18 of the upper chip 16 and the lower chip 12.

Because the intermediate chips 22 and 24 are fixed to the lower chip 12 in a state of non-contact with the base portion 15 and the collar portion 18, it is possible to connect the intermediate chips 22 and 24 to the glass epoxy substrate 10 using the Au wires 40 and 42.

In general, logic devices have larger external profiles than storage devices. Accordingly, it is expected that the stacked multi-chip package can be made more compact by specifying that the upper chip 16 be a logic device and the intermediate chips 22 and 24 storage devices.

Further, because the profile of the lower chip 12 is set to be substantially the same size as the profile of the upper chip 16, and the collar portion 18 is formed at the upper chip 16, it is possible to stack the small intermediate chips 22 and 24 between these two chip layers. Thus, the chip population area can be made larger with the same overall area.

In the present embodiment, the gap 26 formed between the collar portion 18 and the lower chip 12 is set to a size such that the Au wires 40 and 42 that electrically connect the intermediate chips 22 and 24 with the glass epoxy substrate 10 do not contact the collar portion 18. However, as shown in FIG. 3, an insulation member 50, which is formed of an oxide film, SiN film or resin film of the order of about 0.1 µm, may be provided at a lower face side of the collar portion 18, which opposes the upper face of the intermediate chip 22.

Because the insulation member 50 is provided, there is no problem of the Au wires 40 and 42, which connect the intermediate chips 22 and 24 with the glass epoxy substrate 10, coming into direct contact with the upper chip 16. Therefore, rising heights of the Au wires 40 and 42 when the bonding apparatus is wiring the Au wires 40 and 42 are not restricted. As a result, a level of precision of the bonding apparatus required for lowering the rising heights of the Au wires 40 and 42 can be relaxed, and a degree of freedom of the bonding apparatus to be used can be broadened.

Figure 3:
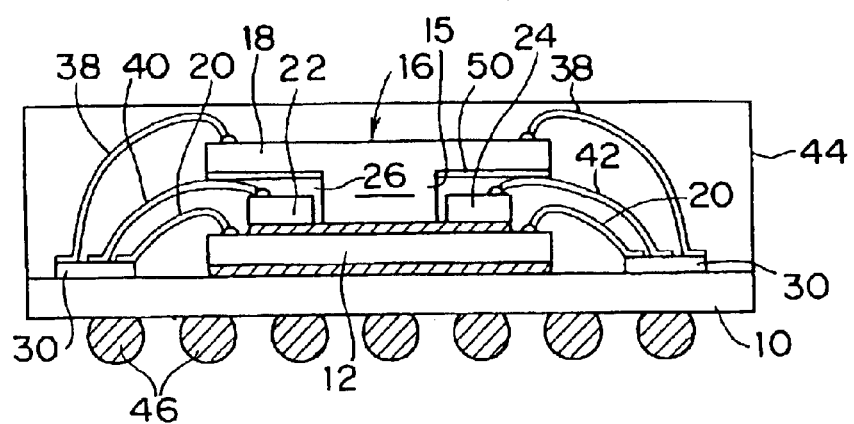
FIG. 3 is a sectional view showing a second embodiment of the stacked multi-chip package of the present invention.
Figure 4:
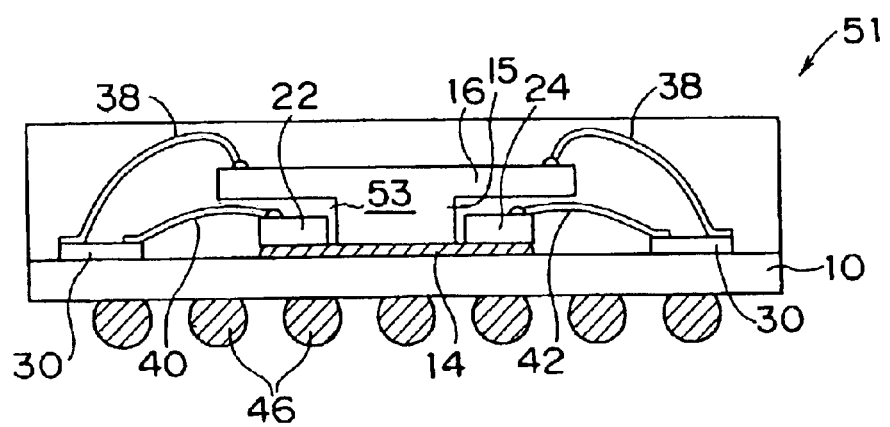
FIG. 4 is a sectional view showing a third embodiment of the stacked multi-chip package of the present invention.

In the present embodiment, as shown in FIG. 3, the lower chip 12 is fixed on the glass epoxy substrate 10. However, as shown in FIG. 4, the upper chip 16 may be fixed to the glass epoxy substrate 10 and the intermediate chips 22 and 24 disposed in a gap 53 formed between the upper chip 16 and the glass epoxy substrate 10, to provide a stacked multi-chip package 51 with a two-chip layer structure.

Furthermore, an unillustrated metallic lead frame may be used instead of the glass epoxy substrate 10. A further reduction in material costs due to using the metallic lead frame instead of the glass epoxy substrate 10 can be effectuated.

Al pads 54 of a lower chip 52, as shown in FIG. 5 (here, for the sake of convenience, intermediate chips are omitted from the drawing), have a structure in which first electroless nickel plating of about 3 to 5 µm is formed by an electroless plating process, and next, electroless gold plating of about 0.05 to 0.1 µm is provided by an electroless plating process.

Accordingly, because the Al pads 54 of the lower chip 52 are electroless nickeled and gold plated, the Al pads 54 play a role as impact absorbers, and bonding from bonding posts 58 of a glass epoxy substrate 56 to the Al pads 54 of the lower chip 52 is enabled.

During the interconnection of the Au wires 60 from the glass epoxy substrate 56 to the lower chip 52, the Au wires 60 rises at the bonding posts 58. Thus, the height of the Au wires 60 at the lower chip 52 can be made lower. Accordingly, gaps 64, which are formed between an upper chip 62 and the lower chip 52, can be made smaller, and the thickness of a stacked multi-chip package 66 can be made thinner.

As shown in FIG. 2B, the intermediate chip 22 and the intermediate chip 24 are disposed in the gap 26. However, three or more intermediate chips can be disposed in the gap 26, as long as sizes thereof enable such disposition.

Further, as shown in FIGS. 1 through 5, the collar portion 18 extends outward from the four sides at the one end face of the base portion 15. However, it is sufficient that gaps 53, in which the intermediate chip 22 and/or the intermediate chip 24 can be disposed, are provided between the upper chip 16 and the glass epoxy substrate 10. Therefore, it is sufficient that the collar portion 18 extends outward at least from one end of the base portion 15.

Next, a process for fabricating the upper chip that structures the stacked multi-chip package relating to the embodiment of the present invention will be described.

As shown in FIG. 9A, a discoid double-sided adhesive tape 72 is adhered to a metal ring 70, and a discoid silicon wafer 76 is stuck onto the double-sided adhesive tape 72 with the rear face of the silicon wafer 76 upward.

Figure 10:
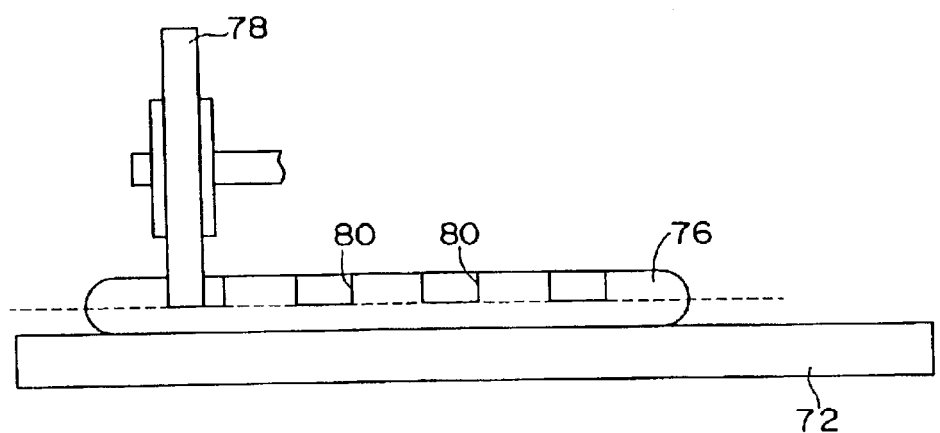
FIG. 10 illustrates a process for producing the upper chip structuring the stacked multi-chip package relating to the embodiment of the present invention, and shows a state in which the wafer is being cut.

Then, in order to form the collar portion 18 at the upper chip 16 as shown in FIG. 2A, half-cut portions 80, which serve as recess portions, are formed in the rear face of the silicon wafer 76 by a circular blade 78, shown in FIG. 10. The half-cut portions 80 are cut in a lattice form of intersecting mutually parallel lines. Here, the width of the circular blade 78 may have the same dimension as a predetermined machining dimension. However, if the width of the circular blade 78 is narrow, the half-cut portions 80 may be formed by a number of repetitions of machining.

Then, as shown in FIG. 9B, the silicon wafer 76 is scribed along width direction center lines of the half-cut portions 80, and is separated into individual pieces. Thus, a plurality of the upper chip 16 can be obtained.

Accordingly, because the half-cut portions 80 are cut into the rear face of the silicon wafer 76 to serve as the recess portions, the upper chip 16 provided with the collar portion 18 can be formed easily. Therefore, material costs are saved, there are fewer steps, and thus productivity is improved.

Figure 11:
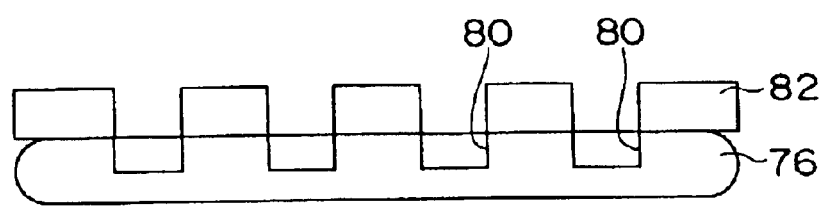
FIG. 11 illustrates another process for producing the upper chip structuring the stacked multi-chip package relating to the embodiment of the present invention, and it also shows a state in which the wafer has been etched.
Figure 12:
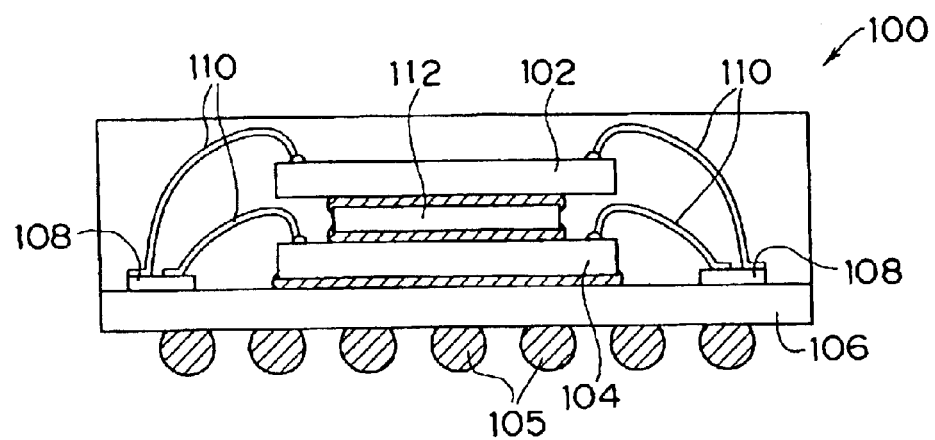
FIG. 12 is a sectional view showing a conventional stacked multi-chip package.

Alternatively, instead of machining the half-cut portions 80 to serve as the recess portions in the rear face of the silicon wafer 76, the half-cut portions 80 may be formed by etching. As shown in FIG. 11, the rear face of the silicon wafer 76 is masked by an etching mask 82 which exposes portions corresponding to the half-cut portions 80. Then, when etching is carried out with a chemical solution, for example NaOH or a similar compound capable of etching the silicon wafer 76, exposed portions of the silicon wafer 76 are corroded, and the half-cut portions 80 are formed.

Figure 6:
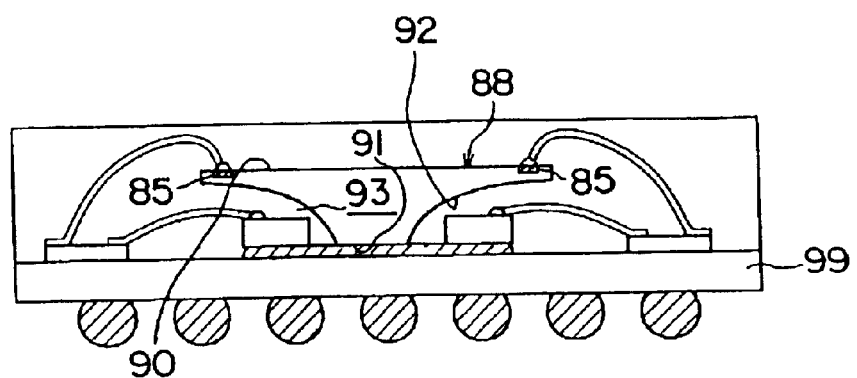
FIG. 6 is a sectional view showing a second embodiment of an upper chip provided in the stacked multi-chip package of the present invention.

For the stacked multi-chip package relating to the present embodiment, as shown in FIGS. 1 through 5 and FIGS. 9A through 11, descriptions have been given for, as an example, the upper chip 16 which has a cross-sectional form which is T-shaped. However, the upper chip is not limited to such a shape. As shown in FIG. 6, a side face 92 joining an upper face 90 and a lower face 91 of an upper chip 88 may have a curved shape (an arc shape) or, as shown in FIG. 7, a side face 97 joining an upper face 95 and a lower face 96 of an upper chip 94 may be slanted, with the upper chip having a cross-sectional form which is trapezoidal.

Figure 7:
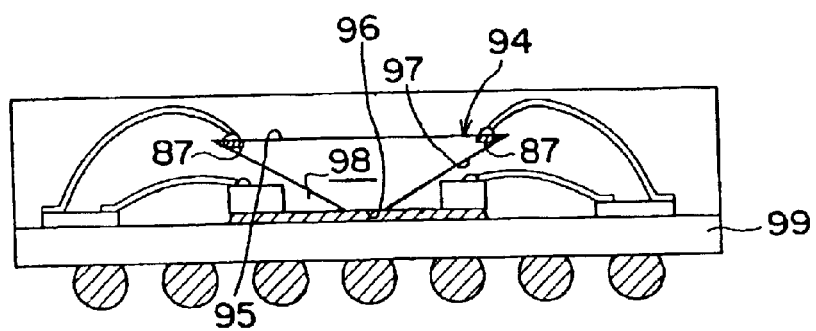
FIG. 7 is a sectional view showing a third embodiment of the upper chip provided in the stacked multi-chip package of the present invention.

Specifically, with the upper chips 88 and 94 shown in FIGS. 6 and 7, the side face 92 or 97, respectively, is provided to connect between the lower face 91 or 96, which is fixed to an upper face of a substrate 99, and the upper face 90 or 95, on which Al pads 85 or 87 are formed. Thus, a gap 93 or 98 can be provided between the upper face of the substrate 99 and the side face 92 or 97 of the upper chip 88 or 94.

Figure 8:
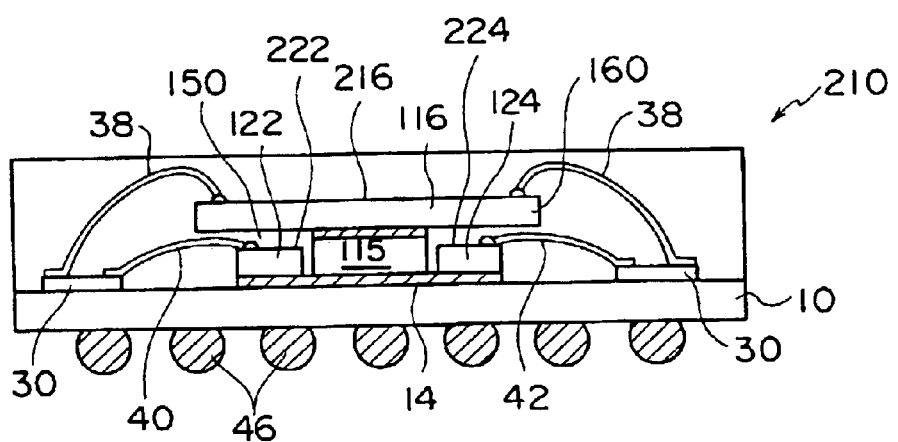
FIG. 8 is a sectional view showing a fourth embodiment of the upper chip provided in the stacked multi-chip package of the present invention.

Now, a variant example of the stacked multi-chip package of the present embodiment will be described. As shown in FIG. 8, a stacked multi-chip package 210 is provided with a chip body 216 including a first face 160, and fixed chips 122 and 124. The first face 160 forms gap 150 between the first face 160 and the upper face of the substrate 10. The chip body 216 is fixed to the substrate 10. The fixed chips 122 and 124 are disposed in the gap 150 and fixed to the substrate 10 so as not to contact with the chip body 216. The fixed chips 122 and 124 include upper faces 222 and 224, respectively, which oppose the first face 160 of the chip body 216. The upper faces 222 and 224 are characterized by being disposed upward relative to a portion connecting the chip body 216 with the substrate 10. More specifically, the chip body 216 is provided with a chip 116, which features the gap 150 between the chip 116 and the upper face of the substrate 10, and the spacer 115, who is disposed between the chip 116 and the substrate 10. Of course, when the chip body 216 of the above-described structure is provided, a face of the chip 116 that opposes the substrate 10 (e.g., the first face 160) may be provided with an insulating body or the like, and structures similar to those of the previously described stacked multi-chip package embodiment can be utilized.

Because the present invention includes the structures described above, a gap can be provided between a first chip and a substrate. Accordingly, a second chip can be disposed to utilize this gap, and effective use of the gap is enabled.

What is claimed is:

1. A stacked multi-chip package comprising:
   a substrate;
   a first chip which is fixed to an upper face of the substrate and include a main surface having a first circuit element formed thereon, the first chip including a collar portion which faces the upper face of the substrate and is configured such that a gap is provided between the upper face of the substrate and the collar portion; and
   a second chip which includes a main surface having a second circuit element formed thereon, the second chip being disposed in a region below the collar portion and fixed to the substrate such that the main surface of the second chip is disposed without contacting the first chip.

2. The stacked multi-chip package of claim 1, wherein a cross-section of the first chip substantially comprises a T shape.

3. The stacked multi-chip package of claim 1, further comprising a connection member which electrically connects the second chip with the substrate, and wherein the gap is of a size such that the connection member does not make contact with the collar portion.

4. The stacked multi-chip package of claim 1, further comprising an insulation member on a side of the collar portion which faces the upper face of the substrate.

5. The stacked multi-chip package of claim 3, wherein the second chip includes an electrode pad to which the connection member is electrically connected, the electrode pad including nickel and gold.

6. The stacked multi-chip package of claim 5, wherein the connection member comprises metallic wire which is wired from the substrate to the second chip.

7. The stacked multi-chip package of claim 1, wherein the first circuit element comprises a logic device and the second circuit element comprises a storage device.

8. The stacked multi-chip package of claim 1, further comprising a third chip interposed between the substrate and the first and second chips, an outline of the third chip being substantially the same size as an outline of the first chip.

9. The stacked multi-chip package of claim 1, wherein the first chip and the substrate are electrically connected by metallic wire wired from the first chip to the substrate, and the collar portion has a thickness which is not less than half of a thickness of the first chip.

10. A stacked multi-chip package comprising:
   a substrate;
   a first chip including an upper face which includes a first electrode pad, a lower face whose area is smaller than an area of the upper face, and a side face connecting the upper face and the lower face, the lower face being fixed on the substrate;
   a first metallic wire electrically connecting the first electrode pad with the substrate;
   a second chip disposed below the first chip and including an upper face which includes a second electrode pad, the second chip being disposed at a location separated by a predetermined distance from the side face of the first chip; and
   a second metallic wire electrically connecting the second electrode pad with the substrate,
   wherein the upper face of the first chip includes a first circuit element connected to the first electrode pad and the upper face of the second chip includes a second circuit element connected to the second electrode pad.

11. The stacked multi-chip package of claim 10, wherein a cross-section of the first chip substantially comprises a T shape.

12. The stacked multi-chip package of claim 10, wherein the second metallic wire includes a peak portion, and a distance from the upper face of the second chip to the side face of the first chip is greater than a distance from the upper face of the second chip to the peak portion.

13. The stacked multi-chip package of claim 10, further comprising an insulation member at on the side face of the first chip.

14. The stacked multi-chip package of claim 10, wherein the second electrode pad includes nickel and gold.

15. The stacked multi-chip package of claim 14, wherein the second metallic wire is wired from the substrate to the second chip.

16. The stacked multi-chip package of claim 10, wherein the first circuit element comprises a logic device and the second circuit element comprises a storage device.

17. The stacked multi-chip package of claim 10, further comprising a third chip interposed between the substrate and the first and second chips, an outline of the third chip being substantially the same size as a an outline of the first chip.

18. A stacked multi-chip package comprising:
   a substrate including a front face;
   a chip body fixed at cm the front face of the substrate and including an upper portion which has first circuit element thereon, with a gap being formed between the upper portion and the front face of the substrate, and a connecting portion which connects the chip body with the substrate; and
   a fixed chip fixed at on the front face of the substrate without contacting the chip body, at least a portion of the fixed chip being disposed in the gap,
   wherein the portion of the fixed chip that is disposed in the gap includes an upper face which opposes the first face portion of the chip body, and the upper face is disposed upward relative to the connecting portion, and
   wherein the upper portion of the chip body includes the first circuit element connected to a first electrode pad and the upper face of the fixed chip includes a second circuit element connected to a second electrode pad.

19. The stacked multi-chip package of claim 18, wherein the upper portion of the chip body comprises a chip disposed to be separated a predetermined distance above the front face of the substrate; and the connecting portion comprises a spacer disposed between the chip and the substrate.

20. The stacked multi-chip package of claim 18, wherein the upper portion of the chip body comprises a collar portion, and the upper collar portion includes an upper face which has the first circuit element thereon.

21. The stacked multi-chip package of claim 20, wherein the upper portion and the connecting portion of the chip body is are integrally formed.

22. The stacked multi-chip package of claim 21, wherein an elevation cross-section of the chip body substantially comprises a T shape.

23. The stacked multi-chip package of claim 1, wherein the second chip is smaller in area than and disposed wholly within the region below the collar portion of the first chip.

24. The stacked multi-chip package of claim 10, wherein the second chip is smaller in area than and disposed wholly below the first chip.

25. The stacked multi-chip package of claim 1, wherein the second chip is smaller in area than upper portion of the first chip and disposed wholly within the gap.

* * * * *